(12) United States Patent
Ding

(10) Patent No.: US 9,129,930 B2
(45) Date of Patent: Sep. 8, 2015

(54) POWER TRANSISTOR WITH HEAT DISSIPATION AND METHOD THEREFORE

(71) Applicant: FREESCALE SEMICONDUCTOR, INC., Austin, TX (US)

(72) Inventor: Min Ding, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/331,724

(22) Filed: Jul. 15, 2014

(65) Prior Publication Data

US 2014/0327124 A1  Nov. 6, 2014

Related U.S. Application Data

(62) Division of application No. 13/538,535, filed on Jun. 29, 2012, now Pat. No. 8,790,964.

(51) Int. Cl.
*H01L 23/34* (2006.01)
*H01L 23/36* (2006.01)
*H01L 23/42* (2006.01)
*H01L 23/433* (2006.01)
*H01L 23/495* (2006.01)
*H01L 23/367* (2006.01)

(52) U.S. Cl.
CPC .............. *H01L 23/36* (2013.01); *H01L 23/367* (2013.01); *H01L 23/42* (2013.01); *H01L 23/4334* (2013.01); *H01L 23/49562* (2013.01); *H01L 2224/48091* (2013.01); *H01L 2224/48137* (2013.01); *H01L 2224/48247* (2013.01); *H01L 2924/00014* (2013.01)

(58) Field of Classification Search
CPC ...... H01L 23/36; H01L 23/3677; H01L 23/42
USPC .......... 275/675, 676, 712, 713, 796, E23.015, 275/E23.101, E23.102, E23.103, E23.105
See application file for complete search history.

(56) References Cited

U.S. PATENT DOCUMENTS

| | | | |
|---|---|---|---|
| 5,659,458 A * | 8/1997 | Patchen | 361/704 |
| 6,218,732 B1 | 4/2001 | Russell et al. | |
| 6,667,546 B2 * | 12/2003 | Huang et al. | 257/691 |
| 7,196,904 B2 * | 3/2007 | Ku | 361/703 |
| 7,821,116 B2 | 10/2010 | Madrid | |
| 7,821,124 B2 | 10/2010 | Joshi et al. | |
| 7,851,897 B1 | 12/2010 | Cate et al. | |
| 8,026,590 B2 * | 9/2011 | Kang et al. | 257/690 |
| 8,294,276 B1 * | 10/2012 | Kim et al. | 257/775 |
| 8,790,964 B2 * | 7/2014 | Ding | 438/122 |
| 2003/0001248 A1 | 1/2003 | Alcoe et al. | |
| 2004/0183174 A1 | 9/2004 | Huang et al. | |
| 2005/0104197 A1 | 5/2005 | Houle et al. | |
| 2005/0231911 A1 * | 10/2005 | Furuyama et al. | 361/695 |
| 2006/0226540 A1 | 10/2006 | Huang et al. | |
| 2006/0237827 A1 * | 10/2006 | Wu et al. | 257/676 |
| 2007/0108598 A1 | 5/2007 | Zhong et al. | |
| 2007/0296077 A1 | 12/2007 | Dan | |

(Continued)

*Primary Examiner* — Joseph C Nicely

(57) ABSTRACT

A device comprising a substrate, an integrated circuit (IC) die attached to the substrate on one side, a plurality of contact pads on an active side of the IC die, a plurality of thermally and electrically conductive legs, each of the legs attached to a respective one of the contact pads, and an encapsulating material formed around the substrate, the IC die, and a portion of the legs. A contact end of each of the legs is exposed, and one of the contact ends conducts a signal from a transistor in the IC die.

15 Claims, 3 Drawing Sheets

(56) References Cited

U.S. PATENT DOCUMENTS

| | | | |
|---|---|---|---|
| 2009/0115037 A1* | 5/2009 | How et al. | 257/675 |
| 2009/0230527 A1* | 9/2009 | Shen | 257/676 |
| 2012/0326288 A1* | 12/2012 | Huang et al. | 257/676 |

* cited by examiner

POWER TRANSISTOR WITH HEAT DISSIPATION AND METHOD THEREFORE

BACKGROUND

1. Field

This disclosure relates generally to power transistors, and more specifically, to power transistors with heat dissipation.

2. Related Art

Power transistors typically generate a significant amount of heat due to some combination of high heat and high current. The ability to dissipate that heat can be very significant in the ability to maintain a functional power transistor over the expected life of the product that uses the power transistor. Also reliability can be an extremely significant issue in some products such as automotive products. The heat itself can become destructive as can high current density even independent of the heat. Current and heat are related, but if the current density becomes too high, degradation at joints in the conductive path can degenerate and eventually fail.

Accordingly there is a need to provide a power transistor with heat dissipation that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a power die having at least one power transistor is mounted to a package substrate. A heat spreader of metal that is shaped similar to a table having a tabletop and legs. The legs are attached to electrical connections on the power die. Encapsulation is performed so that the tabletop is exposed and is coplanar with a top surface of the encapsulant. The tabletop is then partitioned so that the electrical connections of the power die are individually extended to the top surface of the encapsulant as portions of the tabletop. The portions of the tabletop then may conveniently be attached to a printed circuit board. This results in contacts for the power die being relatively large metal portions from the metal tabletop so that current density is reduced and power is dissipated.

Figure 1:
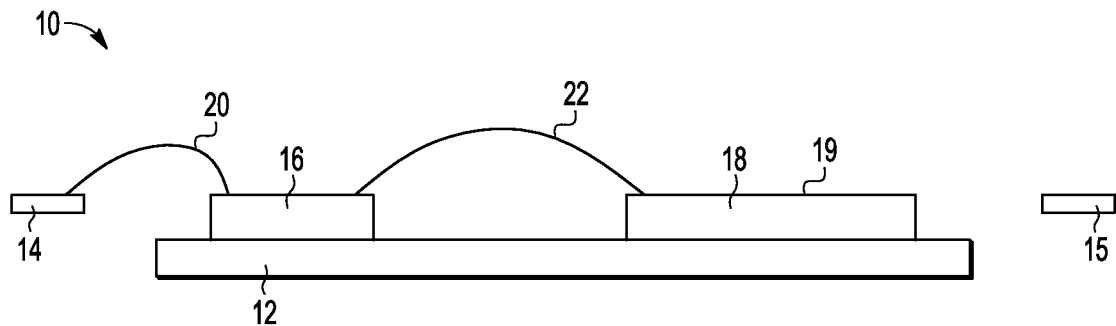
FIG. 1 is a cross section of a power transistor device structure at a stage in processing.

Shown in FIG. 1 is a power transistor device structure 10 having a package substrate 12 that may be a flag, a lead 14, a lead 15, a control integrated circuit 16 mounted on a top side of substrate 12, a power die 18 having an active surface 19, a wire bond 20 electrically connecting lead 14 to integrated circuit 16, and a wire bond 22 electrically connecting power die 18 to control integrated circuit 16. The control of power die 18 is achieved through control integrated circuit 16 in this example. Lead 15 may not necessarily be electrically connected but forms part of a leadframe that supports substrate 12. The leadframe as shown in FIG. 1, which is conventional, comprises substrate 12, lead 14, and lead 15 and further includes other leads and connections not shown in FIG. 1. Power die 18 includes at least one power transistor and may be considered an integrated circuit die.

Figure 2:
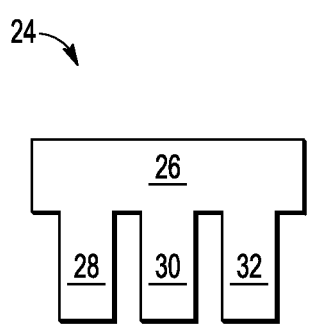
FIG. 2 is a cross section of a heat spreading structure useful in the power transistor device structure of FIG. 1.

Shown in FIG. 2, as a cross section, is a heat spreading structure 24 that is metal, which may be copper, and formed in a shape similar to that of a table. In the portion shown in FIG. 2, which is a cross section, is a continuous top portion that may be referenced as tabletop 26 and separate portions extending downward from tabletop 26 that may be referenced as legs 28, 30, and 32.

Figure 3:
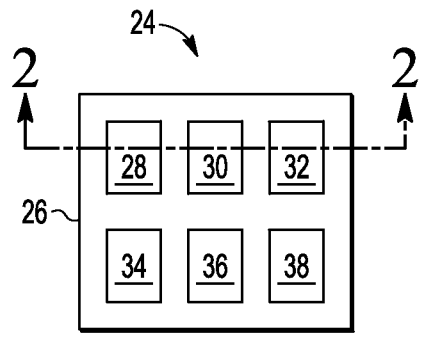
FIG. 3 is a bottom view of the heat spreading structure of FIG. 2.

Shown in FIG. 3, as a bottom view and showing the location of the cross section of FIG. 2, is heat spreading structure 24 further showing legs 34, 36, and 38. This shows legs 28, 30, 32, 34, 36, and 38 in an array in which one row comprises legs 28, 30, and 32 and another row comprises legs 34, 36, and 38. Legs 28, 30, 32, 34, 36, and 38 may each have a square cross section. Square is likely to be the most efficient way but round rectangular may also be effective. The dimensions can vary but are likely to be in the millmeter range. One example may be of about 1 millimeter (mm) square for the cross section and a height of about 2 mm. Another example may be 0.5 mm square. The height can vary as well.

Figure 4:
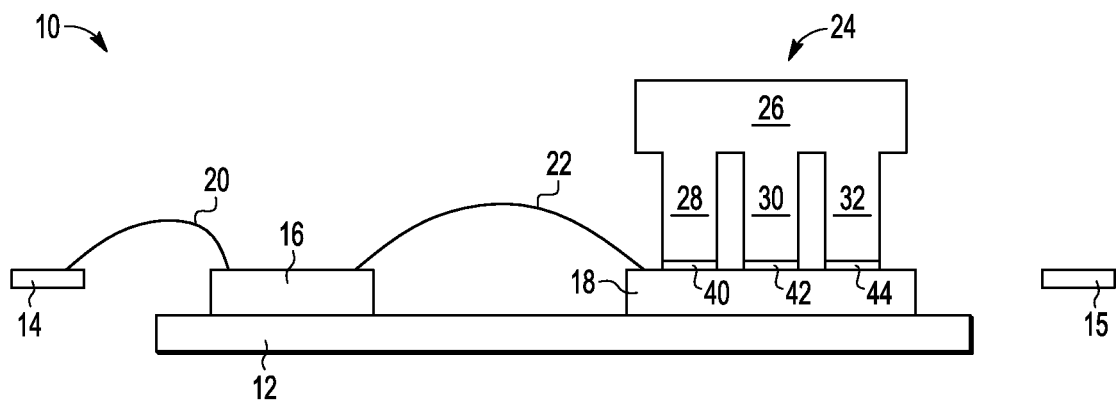
FIG. 4 is a cross section of the power transistor device structure of FIG. 1 at a subsequent stage in processing including mounting the heat spreading structure of FIG. 2.

Shown in FIG. 4 is power transistor device structure 10 after mounting heat spreading structure 24 after mounting legs 28, 30, and 32, to power die 18 with attachment material 40, 42, and 44, respectively. Legs 34, 36, and 38 are also mounted to power die 18 but are not shown in this cross section. The attachment materials 40, 42, and 44 are both electrically and thermally conductive and may be a conductive adhesive. Other connecting techniques such as solder may be used. Power die 18 is designed so that external connections are aligned to legs 28, 30, 32, 34, 36, and 38. The attachment material could also be solder to improve performance but is likely to increase cost, especially in modifying the die.

Figure 5:
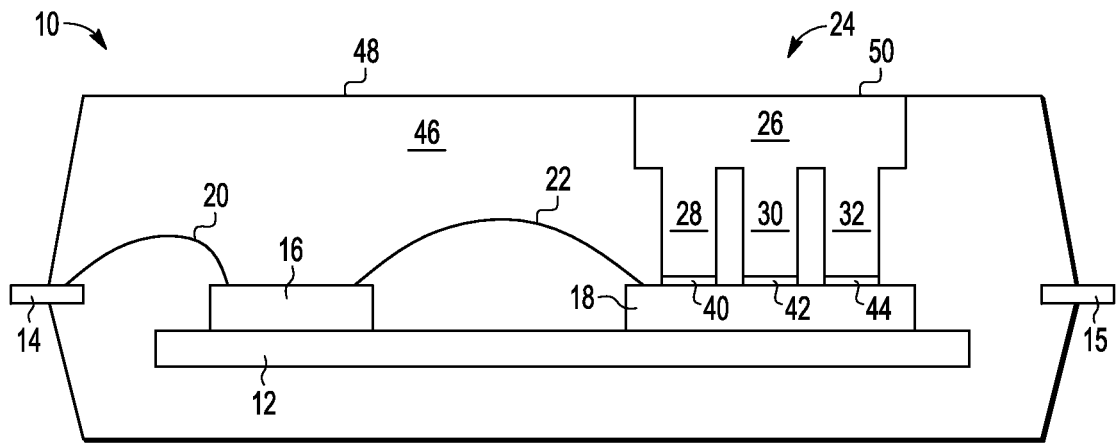
FIG. 5 is a cross section of the power transistor device structure of FIG. 4 at a subsequent stage in processing.

Shown in FIG. 5 is power transistor device structure 10 after an encapsulation that results in an encapsulant 46 having a top surface 48 that is flat and coplanar with a top surface of tabletop 26 which is also flat. Leads such as leads 14 and 15 are partially within encapsulant 46 and partially extend from encapsulant 46.

Figure 6:
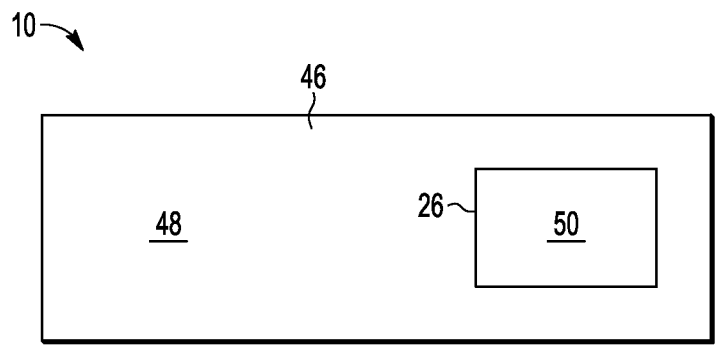
FIG. 6 is a top view of the power transistor device structure of FIG. 5.

Shown in FIG. 6 is a top view of power transistor device structure 10 as shown in FIG. 5. This shows top surface 50 of tabletop 26 and top surface 48 of encapsulant 46.

Figure 7:
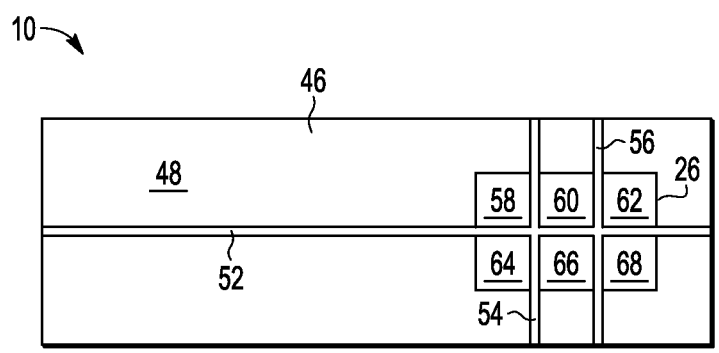
FIG. 7 is a top view of the power transistor device structure of FIGS. 5 and 6 at a subsequent stage in processing.

Shown in FIG. 7 is a top view of power transistor device structure 10 after forming grooves 52, 54, and 56 to result in external contacts 58, 60, 62, 64, 66, and 68 from tabletop 26. Grooves 52, 54, and 56 may be formed using a tool that is used in singulating die with an appropriate depth setting to ensure that tabletop 26 is cut through but not so deep as to result in any damage to other portions of the power transistor device structure 10. It may be important to ensure that wire bonds are not in the path of the groove formation. In the orientation shown in FIG. 7, groove 52 is may be considered to be in the X-direction and and grooves 54 and 56 may be considered to be in the Y-direction. The removing of the portions of tabletop 26 to form external contacts 58, 60, 62, 64, 66, and 68 may also be done by other means than cutting such as using a laser.

Figure 8:
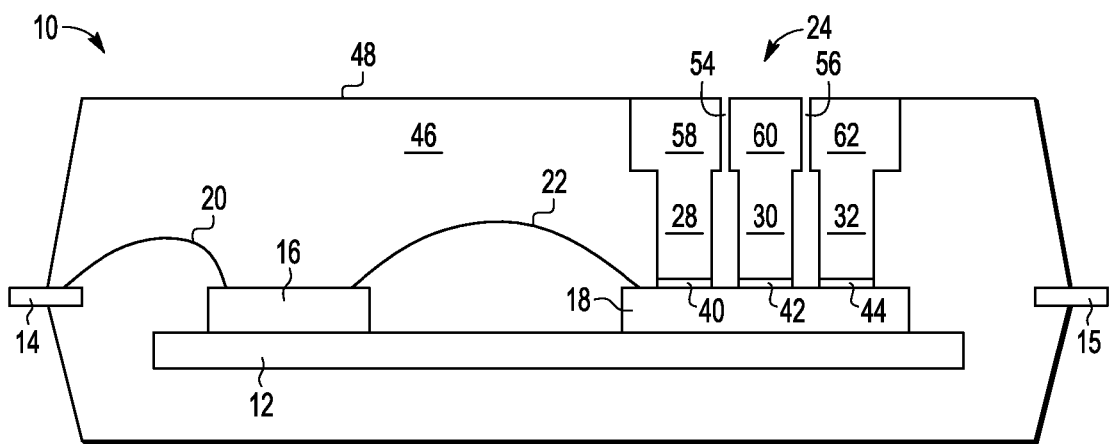
FIG. 8 is a cross section of the power transistor device structure of FIG. 7.

Shown in FIG. 8 is a cross section view similar to that of FIGS. 1, 4, and 5 but at the same stage in processing as shown in FIG. 7. This shows three connections from power die 18 to external to power transistor device structure 10; a first of which is through attachment material 40, leg 28, and external contact 58; a second of which is through attachment material 42, leg 30, and external contact 60; and a third of which is through attachment material 44, leg 32, and external contact 62. This also shows that grooves 54 and 56 extend sufficiently that external contacts 58, 60, and 62 are separated from each other.

Figure 9:
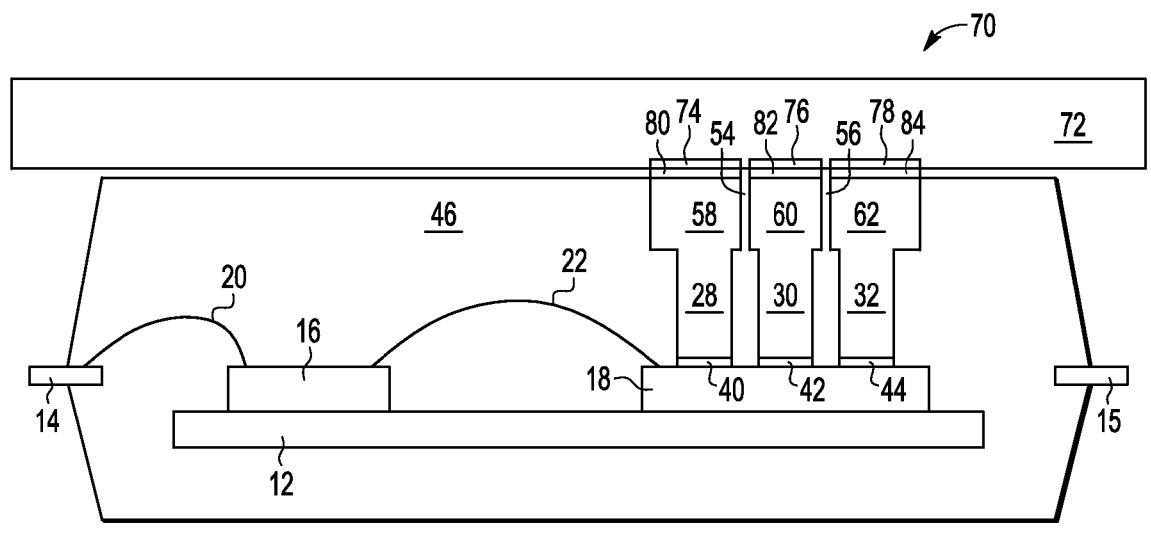
FIG. 9 is a cross section of the power transistor device structure of FIG. 8 after being mounted to a printed circuit board.

Shown in FIG. 9 is a mounted power device 70 after connecting power transistor device structure 10 to a printed circuit board 72 having bond pads 74, 76, and 78. External contact 58 is connected to bond pad 74 with attachment material 80. External contact 60 is connected to bond pad 76 with attachment material 82. External contact 62 is connected to bond pad 78 with attachment material 84. Leads not shown in the FIGs. would also be attached to printed circuit board 72 to hold power transistor device structure 10 in place.

Using the example that high current is conducted from power die 18 through attachment material 40, leg 28, and external contact 58, current density is comparatively low because of the relatively large cross section of leg 28 and external contact 58. This reduces void formation resulting from high current densities. Copper is a relatively good conductor compared to aluminum so that there is less voltage drop due to both the increased cross section and the increased conductivity of copper over aluminum. Further the relative large cross section results in beneficial heat dissipation. One or more of the benefits relating to heat dissipation, current density, and voltage drop, can be used to increase current capability, lifetime, and/or reliability.

Figure 10:
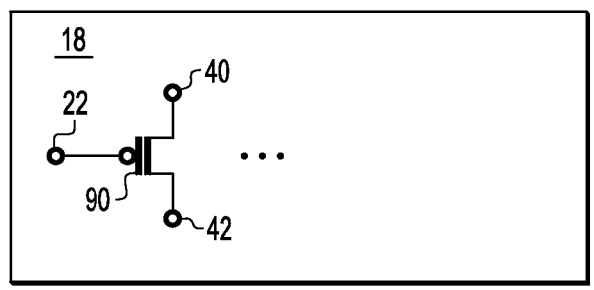
FIG. 10 is a simplified top view of the die of FIGS. 1 and 4-9 having a power transistor.

Shown in FIG. 10 is die 18 showing an exemplary power transistor 90 having a control electrode coupled to wire bond 22, a first current electrode coupled to attachment material 40, and a second current electrode coupled to attachment material 42. Other connections using attachment material, legs, and external contacts may also be implemented for other aspects of die 18 such as other transistors, power, and ground.

Another approach is to attach separate posts in place of legs extending from a tabletop and the forming grooves to break up the tabletop. In such case each post would be separated from the other posts at the time of attachment to the power die. Encapsulation would thus occur with the posts separated and no groove making step would be required. The groove approach appears to provide benefits for stability of placement of the contacts and during encapsulation.

By now it should be appreciated that there has been provided a method that includes attaching a power die to a leadframe. The method further includes attaching a heat spreader to an active surface of the power die, wherein the heat spreader is thermally and electrically conductive, the active surface includes bond pads that are electrically conductive, and the heat spreader includes a flat surface and a plurality of legs attached to one side of the flat surface, each of the legs are attached to a corresponding one of the bond pads. The method further includes molding an encapsulating material to surround the power die, the leadframe, and the legs of the heat spreader, wherein a top side of the flat surface is exposed through the encapsulating material. The method further includes cutting through the flat surface between the legs to form external contacts that are electrically independent of one another. The method may have a further characterization by which the attaching the heat spreader to the leadframe includes using at least one of: a conductive adhesive and a conductive bond. The method may further include the cutting through the flat surface includes using one of a group consisting of: a mechanical saw and a laser. The method may further include forming the legs on the heat spreader by using at least one of the group consisting of: chemical etching, a laser, a punch press, and a mechanical saw. The method may have a further characterization by which the top side of the flat surface is coplanar with a top surface (48) of the encapsulating material. The method may further include attaching a control die to the leadframe and forming a wire bond between the control die and the power die. The method may further include attaching the external contacts to corresponding electrical contacts on a circuit board. The method may have a further characterization by which one of the external contacts conducts a signal from a power transistor in the power die. The method may have a further characterization by which the attaching the heat spreader to the circuit board includes using at least one of: an electrically conductive adhesive and an electrically conductive bond.

Also disclosed is a method that includes attaching a die to a substrate. The method further includes attaching a first end of each of a plurality of legs to an active surface of the die, wherein each of the plurality of legs is thermally and electrically conductive and the active surface includes a plurality of electrically conductive bond pads, each first end of the legs is attached to a corresponding one of the bond pads. The method further includes encapsulating the die and at least part of the legs in a mold compound, wherein each of the legs form at least part of a corresponding one of a plurality of external contacts that are exposed through the mold compound. The method may have a further characterization by which a second end of each of the legs is attached to a surface, the attaching the first end of the legs to the bond pads is performed while each of the second end of the legs is attached to the surface, and one side of the surface is exposed after the encapsulating and the method may further include, after the encapsulating, removing at least a portion of the surface between the legs to form the external contacts, wherein the external contacts are electrically independent of one another. The method may have a further characterization by which the first end of the legs has an exposed surface area that is between 50 and 100 percent of a contact area of the corresponding bond pads. The method may have a further characterization by which the legs retain the same shape before and after the legs are attached to the bond pads of the die. The method may have a further characterization by which the attaching the legs to the substrate includes using at least one of: a conductive adhesive and a conductive bond. The method may further include the removing at least a portion of the surface between the legs to form the external contacts includes using one of a group consisting of: a mechanical saw and a laser. The method may have a further characterization by which the die is a power die and one of the external contacts conducts a signal from a transistor in the die.

Disclosed also is a device that includes a substrate. The device further includes an integrated circuit (IC) die attached to the substrate on one side. The device further includes a plurality of contact pads on an active side of the IC die. The device further includes a plurality of legs that are thermally and electrically conductive, each of the legs attached to a respective one of the contact pads. The device further includes an encapsulating material formed around the substrate, the IC die, and a portion of the legs, a contact end of each of the legs is exposed, and one of the contact ends conducts a signal from a transistor in the IC die. The device may further include another one of the contact ends is coupled between a power supply and the transistor in the IC die. The device may have a further characterization by which the IC die is a power die. The device may further include the legs are attached to the contact pads using one of a group consisting of a conductive adhesive and a conductive bond.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, other metals than copper may be found to be beneficial for the heat spreader. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A device comprising:
    a substrate;
    an integrated circuit (IC) die attached to the substrate on one side;
    a plurality of contact pads on an active side of the IC die;
    a plurality of legs that are thermally and electrically conductive, each of the legs attached to a respective one of the contact pads; and
    an encapsulating material formed around the substrate, the IC die, and a portion of the legs, wherein a top surface of each of the legs is exposed to form contact ends, the contact ends are separated from each other by one or more grooves, the encapsulating material is not formed in the one or more grooves, the top surface of each of the legs is coplanar with a top surface of the encapsulating material, and one of the contact ends conducts a signal from a transistor in the IC die.

2. The device of claim 1 further comprising:
another one of the contact ends is coupled between a power supply and the transistor in the IC die.

3. The device of claim 1 wherein:
the IC die is a power die.

4. The device of claim 1 further comprising:
the legs are attached to the contact pads using one of a group consisting of a conductive adhesive and a conductive bond.

5. The device of claim 1 further comprising:
a circuit board, wherein the contact ends are attached to bond pads of the circuit board.

6. The device of claim 5 wherein:
the contact ends are attached to the bond pads of the circuit board using one of a group consisting of a conductive adhesive, solder, and an electrically and thermally conductive material.

7. The device of claim 1 wherein:
each contact end of the legs has an exposed surface area that is between 50 and 100 percent of a contact area of the corresponding bond pads.

8. A device comprising:
    a leadframe;
    an integrated circuit (IC) die attached to the leadframe;
    a plurality of contact pads on an active side of the IC die;
    a plurality of legs that are thermally and electrically conductive, each of the legs attached to a respective one of the contact pads; and
    an encapsulating material formed around the leadframe, the IC die, and a portion of the legs, wherein a top surface of each of the legs is exposed to form contact ends, the contact ends are separated from each other by one or more grooves, the encapsulating material is not formed in the one or more grooves, the top surface of each of the legs is coplanar with a top surface of the encapsulating material, and one of the contact ends conducts a signal from a transistor in the IC die.

9. The device of claim 8 further comprising:
a control die attached to the leadframe, wherein the control die and the IC die are connected by a wire bond.

10. The device of claim 8 further comprising:
another one of the contact ends is coupled between a power supply and the transistor in the IC die.

11. The device of claim 8 wherein:
the IC die is a power die.

12. The device of claim 8 further comprising:
the legs are attached to the contact pads using one of a group consisting of a conductive adhesive and a conductive bond.

13. The device of claim 8 further comprising:
a circuit board, wherein the contact ends are attached to bond pads of the circuit board.

14. The device of claim 13 wherein:
the contact ends are attached to the bond pads of the circuit board using one of a group consisting of a conductive adhesive, solder, and an electrically and thermally conductive material.

15. The device of claim 8 wherein:
each contact end of the legs has an exposed surface area that is between 50 and 100 percent of a contact area of the corresponding bond pads.

\* \* \* \* \*